United States Patent
Lim et al.

(10) Patent No.: US 11,404,374 B2
(45) Date of Patent: Aug. 2, 2022

(54) CIRCUITS EMPLOYING A BACK SIDE-FRONT SIDE CONNECTION STRUCTURE FOR COUPLING BACK SIDE ROUTING TO FRONT SIDE ROUTING, AND RELATED COMPLEMENTARY METAL OXIDE SEMICONDUCTOR (CMOS) CIRCUITS AND METHODS

(71) Applicant: QUALCOMM Incorporated, San Diego, CA (US)

(72) Inventors: Hyeokjin Lim, San Diego, CA (US); Stanley Seungchul Song, San Diego, CA (US); Foua Vang, Sacramento, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/038,098

(22) Filed: Sep. 30, 2020

(65) Prior Publication Data

US 2022/0102266 A1  Mar. 31, 2022

(51) Int. Cl.
*H01L 23/528* (2006.01)
*H01L 27/092* (2006.01)
(Continued)

(52) U.S. Cl.
CPC ...... *H01L 23/528* (2013.01); *H01L 21/02603* (2013.01); *H01L 21/823807* (2013.01);
(Continued)

(58) Field of Classification Search
CPC ....... H01L 21/02603; H01L 21/823807; H01L 21/823814; H01L 21/823828;
(Continued)

(56) References Cited

U.S. PATENT DOCUMENTS 9,209,305 B1   12/2015   Zhang et al.
9,318,552 B2   4/2016    Xie et al.
(Continued)

OTHER PUBLICATIONS

International Search Report and Written Opinion for International Patent Application No. PCT/US2021/044191, dated Nov. 25, 2021, 13 pages.

*Primary Examiner* — Tong-Ho Kim
(74) *Attorney, Agent, or Firm* — Qualcomm Incorporated

(57) ABSTRACT

Circuits employing a back side-front side connection structure for coupling back side routing to front side routing, and related complementary metal oxide semiconductor (CMOS) circuits and methods are disclosed. The circuit includes a front side metal line disposed adjacent to a front side of a semiconductor device for providing front side signal routing. The circuit also includes a back side metal line disposed adjacent to a back side of the semiconductor device for providing back side signal routing. In this manner, the back side area of the semiconductor device may be employed for signal routing to conserve area and/or reduce routing complexity. The circuit also includes a back side-front side connection structure that electrically couples the front side metal line to the back side metal line to support signal routing from the back side to the front side of the circuit, or vice versa to provide greater routing flexibility.

17 Claims, 13 Drawing Sheets

(51) Int. Cl.
*H01L 29/06* (2006.01)
*H01L 29/423* (2006.01)
*H01L 29/786* (2006.01)
*H01L 21/02* (2006.01)
*H01L 21/8238* (2006.01)
*H01L 29/66* (2006.01)

(52) U.S. Cl.
CPC ........... *H01L 21/823814* (2013.01); *H01L 21/823828* (2013.01); *H01L 21/823871* (2013.01); *H01L 27/092* (2013.01); *H01L 29/0673* (2013.01); *H01L 29/42392* (2013.01); *H01L 29/66545* (2013.01); *H01L 29/66742* (2013.01); *H01L 29/78618* (2013.01); *H01L 29/78696* (2013.01)

(58) Field of Classification Search
CPC .......... H01L 21/823871; H01L 23/528; H01L 27/092; H01L 29/0673; H01L 29/42392; H01L 29/66545; H01L 29/66742; H01L 29/78618; H01L 29/78696
USPC ........................................................ 257/351
See application file for complete search history.

(56) References Cited

U.S. PATENT DOCUMENTS

| | | | |
|---|---|---|---|
| 10,186,484 | B2 | 1/2019 | Nelson et al. |
| 10,319,836 | B1 | 6/2019 | Reznicek et al. |
| 10,325,840 | B2 | 6/2019 | Nelson et al. |
| 10,439,565 | B2 | 10/2019 | Goktepeli |
| 10,607,938 | B1 | 3/2020 | Rubin et al. |
| 10,692,873 | B2 | 6/2020 | Ando et al. |
| 11,164,787 | B2 | 11/2021 | Reznicek et al. |
| 11,270,991 | B1 | 3/2022 | Chava |
| 11,296,083 | B2 | 4/2022 | Lu et al. |
| 11,302,813 | B2 | 4/2022 | Reznicek et al. |
| 2007/0296002 | A1* | 12/2007 | Liang ............... H01L 21/84 257/288 |
| 2014/0367753 | A1 | 12/2014 | Huang et al. |
| 2015/0069520 | A1* | 3/2015 | Lee ............... H01L 24/27 257/371 |
| 2018/0061766 | A1 | 3/2018 | Goktepeli |
| 2019/0164882 | A1 | 5/2019 | Chen et al. |
| 2019/0172828 | A1 | 6/2019 | Smith et al. |
| 2019/0259699 | A1 | 8/2019 | Morrow et al. |
| 2019/0378790 | A1* | 12/2019 | Bohr ............. H01L 21/823475 |
| 2020/0105889 | A1 | 4/2020 | Liaw |
| 2022/0093594 | A1 | 3/2022 | Song |

* cited by examiner

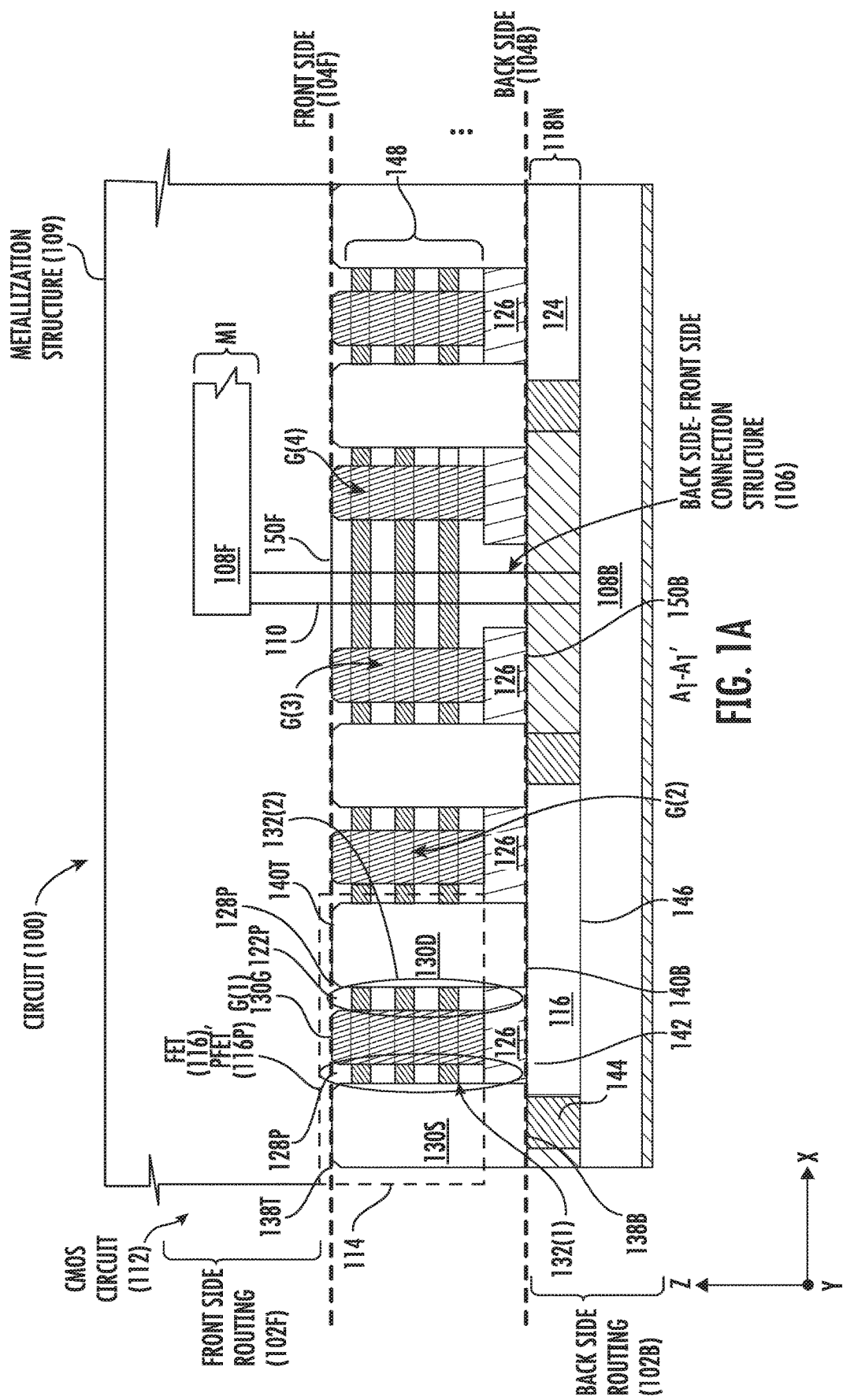

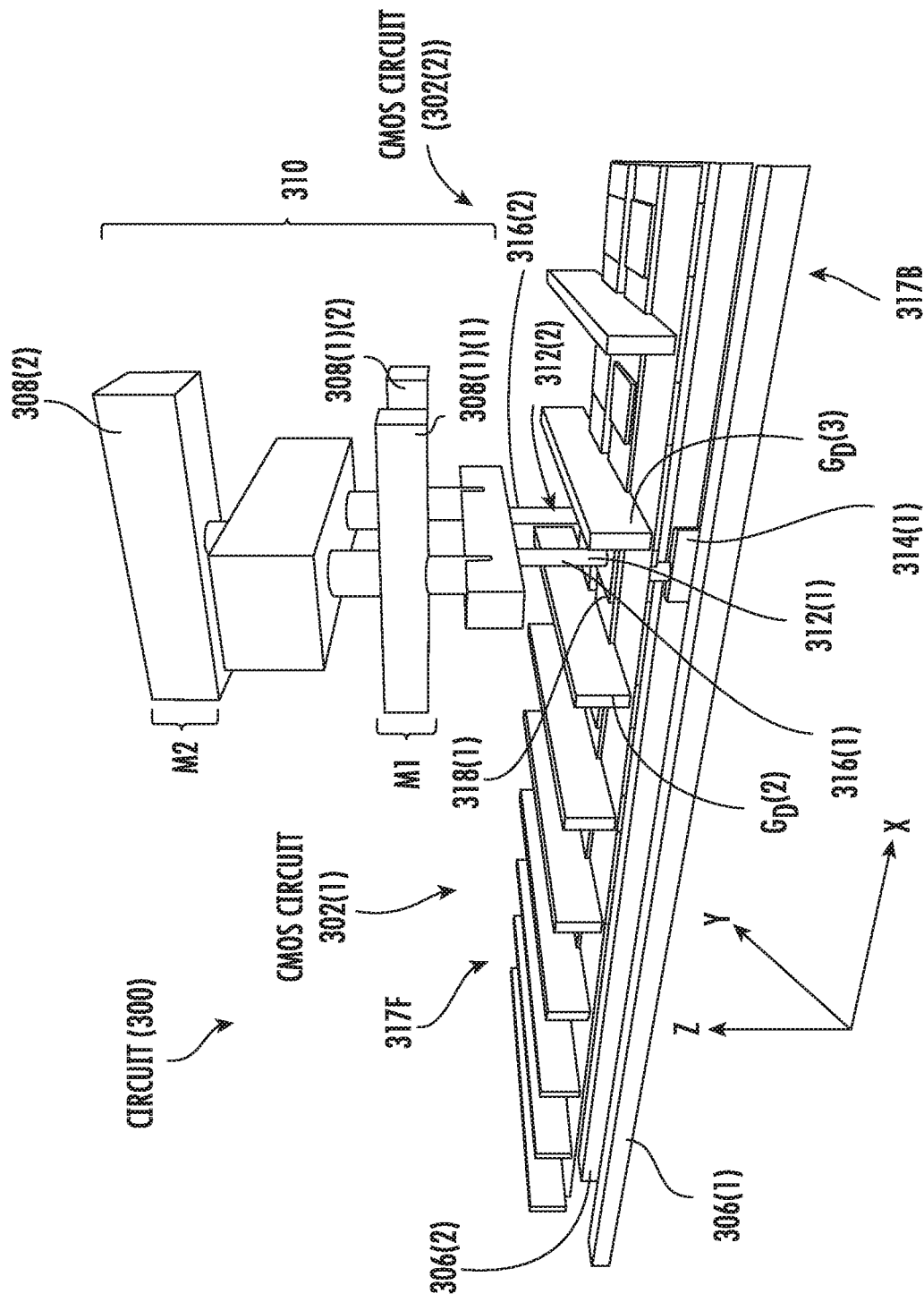

CIRCUITS EMPLOYING A BACK SIDE-FRONT SIDE CONNECTION STRUCTURE FOR COUPLING BACK SIDE ROUTING TO FRONT SIDE ROUTING, AND RELATED COMPLEMENTARY METAL OXIDE SEMICONDUCTOR (CMOS) CIRCUITS AND METHODS

BACKGROUND

I. Field of the Disclosure

The field of the disclosure relates to cell circuits employing a circuit cell architecture for forming of semiconductor devices, including field-effect transistors (FETs) and complementary metal oxide semiconductor (CMOS) integrated circuits employing P-type FETs (PFETs) and N-type FETs (NFETs) for forming logic circuits.

II. Background

Transistors are essential components in modern electronic devices. Large numbers of transistors are employed in integrated circuits (ICs) in many modern electronic devices. For example, components such as central processing units (CPUs), digital signal processors (DSPs), and memory systems each employ a large quantity of transistors for logic circuits and memory devices.

One type of transistor is a field-effect transistor (FET). A FET uses an electric field to control the flow of current between a source and a drain. The flow of current is controlled by application of a voltage to a gate of the FET, which in turn alters the conductivity between the source and the drain. Different types of FETs include planar FETs, Fin FETs (FinFETs), and gate-all-around (GAA) FETs. In ICs that employ a FET, the IC includes source, drain, and gate metal contacts that are formed in contact with the respective source, drain, and gate of the FET to provide signal routing to the FET. The metal contacts are then connected to a metal line in an interconnect layer of the IC that is above the semiconductor or active layer of the IC that includes the FET for routing signals to the source, drain, and gate of the FET through the source, drain, and gate metal contacts. For example, if a circuit employing the FET requires a power signal to be coupled to the source of the FET, the source contact is connected to a metal line that is designed to carry power. As another example, if a circuit employing the FET requires a logic signal to be coupled to the drain of the FET, the drain contact is connected to a metal line that is designed to carry the logic signal.

As the node size of circuits employing FETs is reduced in ICs to conserve area and/or to allow for more FETs to be fabricated in a given area or chip size, the gate pitch between adjacent FETs may also be decreased. This can decrease the distance between the source and the drain of adjacent FETs in an IC, increasing routing congestion in the interconnect layers disposed above the FETs for providing signal routing. Increased signal routing congestion can cause metal lines in the interconnect layers to be disposed closer together, thus increasing parasitic capacitance of the routing lines and thus increasing capacitance of the FETs. Increased capacitance on the FETs can reduce performance of the FETs.

SUMMARY OF THE DISCLOSURE

Aspects disclosed herein include circuits employing a back side-front side connection structure for coupling back side routing to front side routing. Related complementary metal oxide semiconductor (CMOS) circuits and methods are also disclosed. For example, the circuits can include cell circuits that are fabricated according to a circuit cell architecture to support the fabrication of semiconductor devices, such as field-effect transistors (FETs). In exemplary aspects, the circuit includes a semiconductor device. The circuit also includes a front side metal line in a metallization structure disposed adjacent to a front side of the semiconductor device, wherein the front side metal line is configured to be coupled to the semiconductor device (e.g., to a gate, source, and/or drain of a FET) for providing front side signal routing for power or logic signals to the semiconductor device. The circuit also includes a back side metal line disposed adjacent to a back side of the semiconductor device, wherein the back side metal line is configured to be coupled to the semiconductor device (e.g., to a gate, source, and/or drain of a FET) for providing back side routing for power signals or logic signals. In this manner, the area on the back side of the semiconductor device may be advantageously employed for signal routing to conserve area and/or reduce routing complexity.

In further exemplary aspects, the circuit also includes a back side-front side connection structure that electrically couples the front side metal line to the back side metal line for coupling back side routing to front side routing. The back side-front side connection structure is employed to in essence "lift" a signal routed in the back side routing to a front side metal line in the circuit. The back side-front side connection structure can "lift" the back side routed signal to a front side metal line in a desired front side metal layer of the circuit. In this manner, greater routing flexibility can be provided by being able to route signals routed on the back side of the circuit to the front side of the circuit, or vice versa. For example, if power is back side routed, but a circuit only supports front side routing, the back side-front side connection structure allows the power to be routed from the back side to the front side for the circuit. As another example, if a circuit is connected through its package to a power or logic signal source through both a front side and back side interconnect (e.g., bump), the back side-front side connection structure can be employed to couple the front side and back side routing of the signal for enhanced signal routing integrity and/or redundancy.

In further exemplary aspects, the back side-front side connection structure may be a conductive vertical interconnect access (via), such as a through-silicon via (TSV), which is configured to extend through a semiconductor layer of the semiconductor device and couple the front side metal line and the back side metal line. The front side metal line that is coupled to the back side-front side connection structure can be further routed to higher metal layers in the metallization structure for higher metal level routing if needed or desired. Also, in further exemplary aspects, the back side-front side connection structure can be formed adjacent to a dummy gate so as to not interfere with other routing in the circuit. For example, an area adjacent to and/or between adjacent dummy gates on adjacent edges of adjacent circuits may be devoid of routing or has reduced routing. This is also known as "white space." Dummy gates are part of an active semiconductor device, but formed on the edge of a circuit to electrically isolate the circuit from an adjacent circuit. In this manner, the back side-front side connection structure being disposed adjacent to a dummy gate as "white space" may not interfere with another active semiconductor device formed in the circuit. Disposing the back side-front side connection structure adjacent to a dummy gate in a circuit may also avoid, for example, the layout of the circuit having to be enlarged to provide for area for a back side-front side connection structure without interfering with routing to active semiconductor devices.

In another exemplary aspect, a CMOS circuit is provided that includes a substrate including a top surface, a positive (P)-type (P-type) diffusion region disposed in the substrate, and a negative (N)-type (N-type) diffusion region disposed in the substrate. At least one P-type FET (PFET) is formed in the P-type diffusion region, and at least one N-type FET (NFET) is formed in the N-type diffusion region. The PFETs and NFETs in the CMOS circuit each include a conduction channel disposed on a front side of a substrate, a source disposed in a first end portion of its conduction channel, a drain disposed in a second end portion of its conduction channel, and a gate disposed adjacent to its conduction channel. The CMOS circuit includes at least one front side metal line disposed adjacent to a front side of diffusion regions in a metallization structure, wherein the front side metal line is configured to be coupled to at least one of the PFET and NFET (e.g., to its gate, source, and/or drain) for providing front side signal routing for power or logic signals. The CMOS circuit also includes a back side metal line disposed adjacent to a back side of the diffusion regions, wherein the back side metal line is configured to be coupled to at least one of the PFET and NFET (e.g., to its gate, source, and/or drain) for providing back side routing for power signals or logic signals. The CMOS circuit also includes a back side-front side connection structure that electrically couples the front side metal line to the back side metal line to be able to route signals routed on the back side of the CMOS circuit to the front side of the CMOS circuit, or vice versa.

In this regard, in one exemplary aspect, a circuit is provided. The circuit includes a semiconductor device including a front side and a back side, and a metallization structure disposed adjacent to the front side of the semiconductor device, the metallization structure including a front side metal line. The circuit also includes a back side metal line disposed adjacent to the back side of the semiconductor device, the back side metal line coupled to the semiconductor device, and a back side-front side connection structure coupling the back side metal line to the front side metal line.

In another exemplary aspect, a method of fabricating a circuit is provided. The method includes forming a semiconductor device on the substrate, the semiconductor device including a front side and a back side disposed adjacent to the substrate, and forming a metallization structure adjacent to the front side of the semiconductor device, the metallization structure including a front side metal line. The method also includes forming a back side metal line adjacent on the back side of the semiconductor device, coupling the back side metal line to the semiconductor device, and forming a back side-front side connection structure coupling the back side metal line to the front side metal line.

In another exemplary aspect, a CMOS circuit is provided. The CMOS circuit includes a PFET, an NFET, and a metallization structure disposed adjacent to a front side of at least one of the PFET and the NFET, the metallization structure including a front side metal line. The CMOS circuit also includes a back side metal line disposed adjacent to a back side of at least one of the NFET and the PFET, the back side metal line coupled to at least one of the NFET and the PFET, and a back side-front side connection structure coupling the back side metal line to the front side metal line.

BRIEF DESCRIPTION OF THE FIGURES

FIGS. 1A and 1B are respective cross-sectional side and top views of an exemplary circuit that includes field-effect transistors (FETs) and that includes back side routing to the FET and front side routing, and includes a back side-front side connection structure coupling the back side routing to front side routing;

FIGS. 3B-1 and 3B-2 are right and left, front perspective views, respectively, of the circuit in FIG. 3A;

DETAILED DESCRIPTION

Figure 1B:
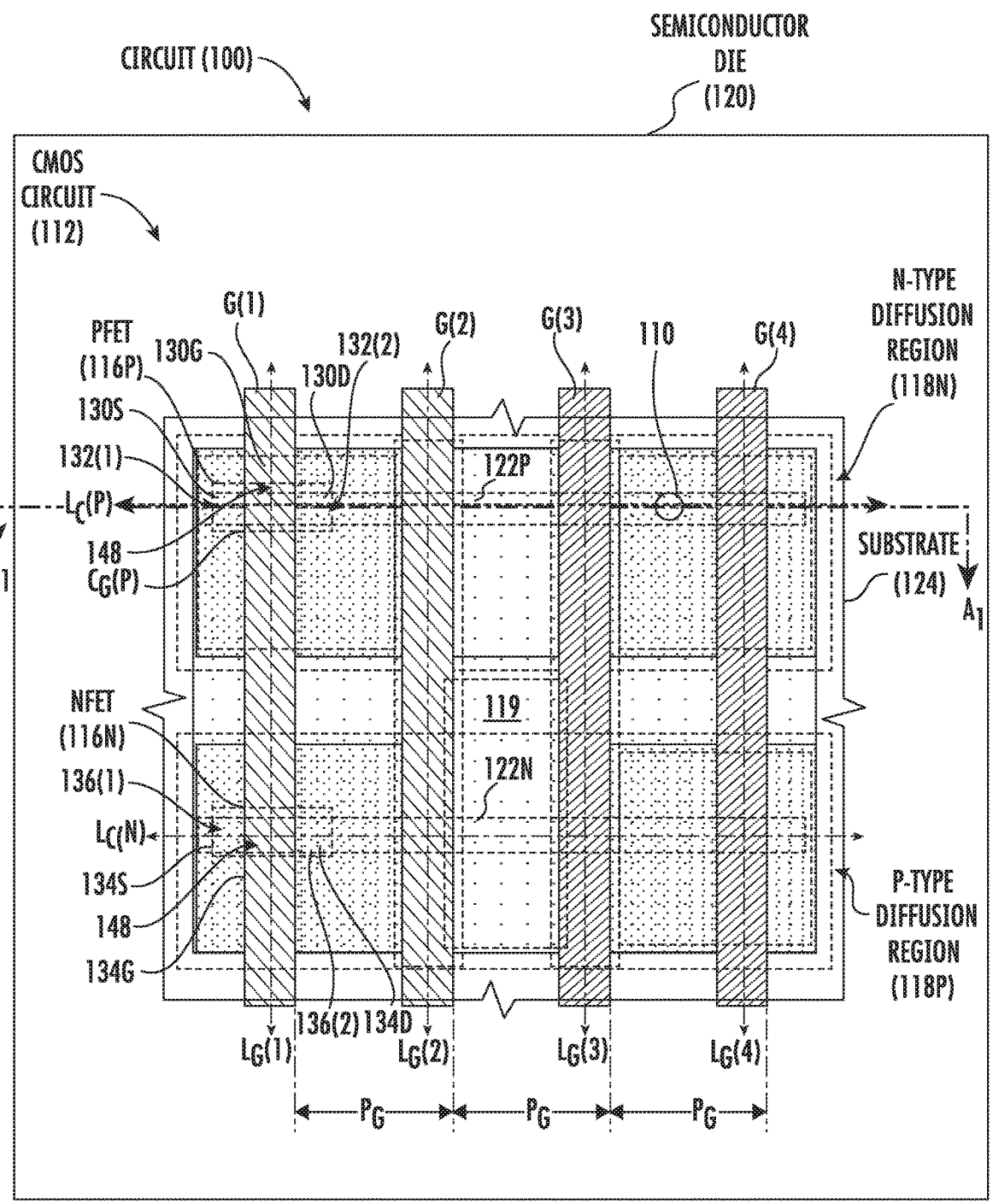

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include circuits employing a back side-front side connection structure for coupling back side routing to front side routing. Related complementary metal oxide semiconductor (CMOS) circuits and methods are also disclosed. For example, the circuits can include cell circuits that are fabricated according to a circuit cell architecture to support the fabrication of semiconductor devices, such as field-effect transistors (FETs). In exemplary aspects, the circuit includes a semiconductor device. The circuit also includes a front side metal line in a metallization structure disposed adjacent to a front side of the semiconductor device, wherein the front side metal line is configured to be coupled to the semiconductor device (e.g., to a gate, source, and/or drain of a FET) for providing front side signal routing for power or logic signals to the semiconductor device. The circuit also includes a back side metal line disposed adjacent to a back side of the semiconductor device, wherein the back side metal line is configured to be coupled to the semiconductor device (e.g., to a gate, source, and/or drain of a FET)

for providing back side routing for power signals or logic signals. In this manner, the area on the back side of the semiconductor device may be advantageously employed for signal routing to conserve area and/or reduce routing complexity.

In further exemplary aspects, the circuit also includes a back side-front side connection structure that electrically couples the front side metal line to the back side metal line for coupling back side routing to front side routing. The back side-front side connection structure is employed to in essence "lift" a signal routed in the back side routing to a front side metal line in the circuit. The back side-front side connection structure can "lift" the back side routed signal to a front side metal line in a desired front side metal layer of the circuit. In this manner, greater routing flexibility can be provided by being able to route signals routed on the back side of the circuit to the front side of the circuit, or vice versa. For example, if power is back side routed, but a circuit only supports front side routing, the back side-front side connection structure allows the power to be routed from the back side to the front side for the circuit. As another example, if a circuit is connected through its package to a power or logic signal source through both a front side and back side interconnect (e.g., bump), the back side-front side connection structure can be employed to couple the front side and back side routing of the signal for enhanced signal routing integrity and/or redundancy.

In this regard, FIGS. 1A and 1B are respective cross-sectional side and top views of an exemplary circuit 100. FIG. 1A is a cross-sectional side view of the circuit 100 in FIG. 1B along the $A_1$-$A_1$' cross-section line. As will be discussed in more detail below, the circuit 100 includes back side routing 102B on a back side 104B of the circuit 100. The circuit 100 also includes front side routing 102F on a front side 104F of the circuit 100. The circuit 100 also includes a back side-front side connection structure 106 coupling a back side metal line 108B in the back side routing 102B on the back side 104B, to a front side metal line 108F in a metallization structure 109 in the front side routing 102F on the front side 104F. The front side metal line 108F can be in any metal layer of a metallization structure, but in this example, the front side metal line 108F is in a metal one (M1) layer. For example, the back side-front side connection structure 106 may be a vertical interconnect access (via) 110, such as a through-silicon via (TSV). The back side-front side connection structure 106 is employed to in essence "lift" a signal routed in the back side metal line 108B in the back side routing 102B to the front side metal line 108F in the front side routing 102F in the circuit 100. The back side-front side connection structure 106 can "lift" a back side routed signal to be coupled to the front side metal line 108F.

In this manner, greater routing flexibility can be provided by being able to route signals routed in the back side 104B of the circuit 100 to the front side 104F of the circuit 100, or vice versa. For example, if power is back side routed, but a particular device within the circuit 100 only supports front side routing 102F, the back side-front side connection structure 106 allows the power to be routed from the back side 102B to the front side 102F for the device. As another example, if the circuit 100 is connected through its package to a power or logic signal source through both a front side and back side interconnect (e.g., bump), the back side-front side connection structure 106 can be employed to couple the front side and back side routing 102F, 102B of the signal for enhanced signal routing integrity and/or redundancy. Also, as discussed in more detail below, in one example, the back side-front side connection structure 106 can be located in a "white space" of the circuit 100 where another semiconductor device is not formed and thus there is either no routing or reduced routing to take advantage of this additional area for lifting the back side routing 102B to the front side routing 102F.

In this example, the circuit 100 is a CMOS circuit 112 that includes semiconductor devices 114 that include FETs 116 in this example. The semiconductor devices 114 have a front side 104F and a back side 104B as shown in FIG. 1A. FIG. 1A illustrates a side view of a PFET 116P in the circuit 100. FIG. 1B illustrates a top view of the PFET 116P and an NFET 116N in the circuit 100. As shown in FIG. 1B, the PFET 116P is formed in a negative (N)-type (N-type) diffusion region 118N in the circuit 100, and the NFET 116N is formed in a positive (P)-type (P-type) diffusion region 118P in the circuit 100 as shown in FIGS. 1A and 1B. For example, the N-type diffusion region 118N may be formed by doping a portion of the semiconductor substrate with a pentavalent impurity material as a donor material that is able to give up free electrons in the substrate. The P-type diffusion region 118P may be formed by doping a portion of a semiconductor substrate with an impurity material that is able to leave holes in the substrate. The PFET 116P is formed in the CMOS circuit 112 by forming a P-type source and a P-type drain in the N-type diffusion region 118N. The NFET 116N is formed in the CMOS circuit 112 by forming an N-type source and an N-type drain in the P-type diffusion region 118P. As shown in FIG. 1B, a diffusion break 119 is provided between the P-type diffusion region 118P and the N-type diffusion region 118N to provide electrical isolation between the P-type and the N-type diffusion regions 118P, 118N. The PFET 116P and NFET 116N are GAA FETs in this example, but note that the PFET 116P and NFET 116N could be a planar FET or FinFET as other non-limiting examples. The circuit 100 is formed in a semiconductor die 120. As shown in FIGS. 1A and 1B, the PFET 116P includes a P-type conduction channel 122P. The back side 104B of the PFET 116P is disposed above and adjacent a substrate 124 in the Z-axis direction in this example. The front side 104F of the PFET 116P is disposed adjacent the metallization structure 109 of the circuit 110 in the Z-axis direction in this example. As shown in FIG. 1B, the NFET 116N includes an N-type conduction channel 122N which is disposed above the substrate 124 in the Z-axis direction as shown in FIG. 1B. In this example, as shown in FIG. 1A, the PFET 116P and NFET 116N are semiconductor-on-insulator (SOI) FETs that are disposed on a buried oxide (BOX) layer 126 that is disposed on the substrate 124. Taking the PFET 116P in FIG. 1A as an example, the P-type conduction channel 122P is made out of plurality of respective nanostructures 128P (e.g., nanowires or nanoslabs) made from a semiconductor material to be able to conduct current in response to an electric field. In semiconductor manufacturing, an SOI FET is a FET that is fabricated of a semiconductor device in a layered insulator-silicon substrate, to reduce parasitic capacitance within the device, thereby improving performance. SOI-based devices differ from conventional silicon-built devices in that the silicon junction is above an electrical insulator, which may be silicon dioxide or sapphire. The choice of insulator depends largely on the intended application. The BOX layer 126 is an oxide layer in a SOI substrate, such as $SiO_2$, buried in a silicon wafer at the depth.

With continuing reference to FIGS. 1A and 1B, taking the PFET 116P as an example, the PFET 116P in the circuit 100 includes a P-type source 130S that is disposed in and extends through the BOX layer 126 in the N-type diffusion region 118N in a first end portion 132(1) of the P-type conduction channel 122P. The PFET 116P also includes a P-type drain 130D that is disposed in and extends through the BOX layer 126 in the P-type diffusion region 118P on a second end portion 132(2) of the P-type conduction channel 122P opposite the first end portion 132(1) in the X-axis direction. For example, the P-type source 130S and P-type drain 130D may have been epitaxially grown on the substrate 124 or formed as an implant into the substrate 124. The PFET 116P also includes a P-type gate 130G that is disposed on the BOX layer 126 and above at least a portion of the P-type conduction channel 122P between the first end portion 132(1) and the second end portion 132(2) of the P-type conduction channel 122P. In this example, the P-type gate 130G is comprised of a gate material that surrounds each of the nanostructures 128P of the P-type conduction channel 122P. In this manner, a voltage applied between the P-type gate 130G and the P-type source 130S of the PFET 116P can create an electric field in the P-type conduction channel 122P sufficient to cause the nanostructures 128P of the P-type conduction channel 122P to conduct current between the P-type source 130S and the P-type drain 130D of the PFET 116P.

Similarly, as shown in the top view of the circuit 100 in FIG. 1B, the NFET 116N in the CMOS circuit 112 includes an N-type source 134S that is disposed in and extends through the BOX layer 126 in the P-type diffusion region 118P in a first end portion 136(1) of the N-type conduction channel 122N. The NFET 116N also includes an N-type drain 134D that is disposed in and extends through the BOX layer 126 in the P-type diffusion region 118P on a second end portion 136(2) of the N-type conduction channel 122N opposite the first end portion 136(1) in the X-axis direction. For example, the N-type source 134S and N-type drain 134D may have been epitaxially grown on the substrate 124 or formed as an implant into the substrate 124. The NFET 116N also includes an N-type gate 134G that is disposed on the BOX layer 126 and above at least a portion of the N-type conduction channel 122N between the first end portion 136(1) and the second end portion 136(2) of the N-type conduction channel 122N. In this example, the N-type gate 134G is comprised of a gate material that surrounds nanostructures of the N-type conduction channel 122N. In this manner, a voltage applied between the N-type gate 134G and the N-type source 134S of the NFET 116N can create an electric field in the N-type conduction channel 122N sufficient to cause the N-type conduction channel 122N to conduct current between the N-type source 134S and the N-type drain 134D of the NFET 116N.

With reference to FIG. 1A, in this example, the P-type source 130S of the PFET 116P has a source top surface 138T on the front side 104F and a source bottom surface 138B adjacent the back side 104B. The P-type drain 130D has a drain top surface 140T on the front side 104F and a drain bottom surface 140B adjacent the back side 104B. The source bottom surface 138B and drain bottom surface 140B are in contact with a top surface 142 of the substrate 124. In this example, a back side metal contact 144 is in contact with the source bottom surface 138B of the P-type source 130S of the PFET 116P to provide connectivity between the P-type source 130S and the back side metal line 108B. The back side metal contact 144 is also in contact with the top surface 142 of the substrate 124. The back side metal line 108B is disposed below a bottom surface 146 of the substrate 124. For example, the back side metal contact 144 may be a conductive pillar or via that connects the back side metal contact 144 to the back side metal line 108B. For example, the back side metal contact 144 may be a TSV or other via that is of a sufficiently small diameter to connect the back side metal contact 144 to the back side metal line 108B without disturbing adjacent routing areas. The back side metal line 108B can be a power rail, such as a positive power rail configured to carry a power signal, or can be coupled to a power rail to carry a power signal, as examples. In this manner, the power signal can be routed and coupled to the P-type source 130S of the PFET 116P from the back side 104B of the substrate 124 in this example. In an alternative example, a back side metal contact 144 could also be provided to couple the P-type drain 130D and/or the P-type gate 130G to the back side metal line 108B.

Thus, in this manner, the back side routing 104B of the PFET 116P in FIG. 1A as an example may provide additional area for signal and/or power routing to the PFET 116P and/or NFET 116N that may be advantageously employed to offset any reduction in routing area in the CMOS circuit 112, such as due to reduction of FET node size and/or the increased complexity of circuits that include the CMOS circuit 112. Also, the back side routing 102B may be compatible with existing fabrication methods that provide for fabrication of the CMOS circuit 112 since additional front side routing may not be required.

Note that for example, the P-type source 130S of the PFET 116P is connected to the back side metal line 108B for back side routing 102B, but such is not limiting. As another example, the P-type source 130S could be connected to a front side metal line, such as front side metal line 108F, for additional or only front side routing 102F. The same is the case for the P-type drain 130D and/or P-type gate 130G of the PFET 116P. Further, the P-type source 130S, the P-type drain 130D, and/or the P-type gate 130G of the PFET 116P could be connected by both front side routing 102F and back side routing 102B if desired, for signal and/or power routing.

As shown in FIG. 1B, P-type and N-type conduction channels 122P, 122N are formed in the CMOS circuit 112 above the substrate 124 and extended along longitudinal axes $L_{C(P)}$, $L_{C(N)}$ in the X-axis direction. Gates G(1)-G(4) are formed in the CMOS circuit 112 along longitudinal axes $L_{G(1)}$-$L_{G(4)}$ in the Y-axis direction, orthogonal to the longitudinal axes $L_{C(P)}$, $L_{C(N)}$, of the P-type and N-type conduction channels 122P, 122N in the X-axis direction, and extend above and around at least a portion of the P-type and N-type conduction channels 122P, 122N. The gates G(1)-G(4) are located adjacent to each other and have a gate pitch PG according to the circuit cell layout of the CMOS circuit 112. Gates G(1) and G(4) are active gates of a conductive material, such as metal (referred to herein as "active gates" G(1) or G(4)), and gates G(2) and G(3) are dummy gates of a dielectric material (referred to herein as "dummy gates" G(2) or G(3)). An active gate is a gate that forms part of a FET to control the electric field in the channel region when a sufficient voltage is applied to the gate. A dummy gate is a structure of a gate material that is not part of a FET, but put on the edge of a circuit cell to electrically isolate one circuit cell from an adjacent circuit cell.

In this example, as shown in FIGS. 1A and 1B, the back side-front side connection structure 106 is disposed adjacent to a dummy gate G(3) and extends through the P-type conduction channel 122P in the N-type diffusion region 118N. In this example, the circuit 100 includes two (2) adjacent dummy gates G(3), G(4). The back side-front side connection structure 106 is disposed between the two (2) dummy gates G(3), G(4) in the circuit 100 in this example. For example, dummy gate G(3) may be on an edge of the CMOS circuit 112, and dummy gate G(4) may be on the edge of an adjacent circuit to the CMOS circuit 112. A FET is not using the dummy gates G(3), G(4) in the circuit 100 as a gate. Thus, as shown in FIG. 1A, the area between the dummy gates G(3), G(4) may be devoid of a source or drain structure. This means that locating the back side-front side connection structure 106 between the dummy gates G(3), G(4) allows the back side-front side connection structure 106 to extend upward in the Y-axis direction without being impeded or interfered by other routing that may otherwise be present if a source or drain structure was formed between the dummy gates G(3), G(4). For example, an area adjacent to and/or between adjacent dummy gates G(3), G(4) may be devoid of routing or have reduced routing. This is also known as "white space." In this manner, the back side-front side connection structure 106 being disposed adjacent the dummy gates G(3), G(4) as "white space" may not interfere with another active semiconductor device, such as a FET, formed in the circuit 100. Disposing the back side-front side connection structure 106 adjacent to a dummy gate G(3), G(4) in the circuit 100 may also avoid, for example, the layout of the circuit 100 having to be enlarged to provide for area for the back side-front side connection structure 106 without interfering with other routing.

Also, in this example, with reference to FIG. 1A, the back side-front side connection structure 106 is shown as a single conductive structure (e.g. via, conductive pillar). The back side-front side connection structure 106 extends through the P-type conduction channel 122P as a semiconductor layer 148, also known as an active layer. The semiconductor layer 148 has front side 150F disposed adjacent to the metallization structure 109 on the front side 104F, and a back side 150B disposed adjacent to the substrate 124. The back side-front side connection structure 106 in this example is the via 110 that extends through the semiconductor layer 148 from the front side 150F of the semiconductor layer 148 to the back side 150B of the semiconductor layer 148 and is coupled to the front side metal line 108F and the back side metal line 108B. Note however, that the back side-front side connection structure 106 could also be comprised of multiple elements and contacts to couple to the front side metal line 108F and the back side metal line 108B.

Figure 2:
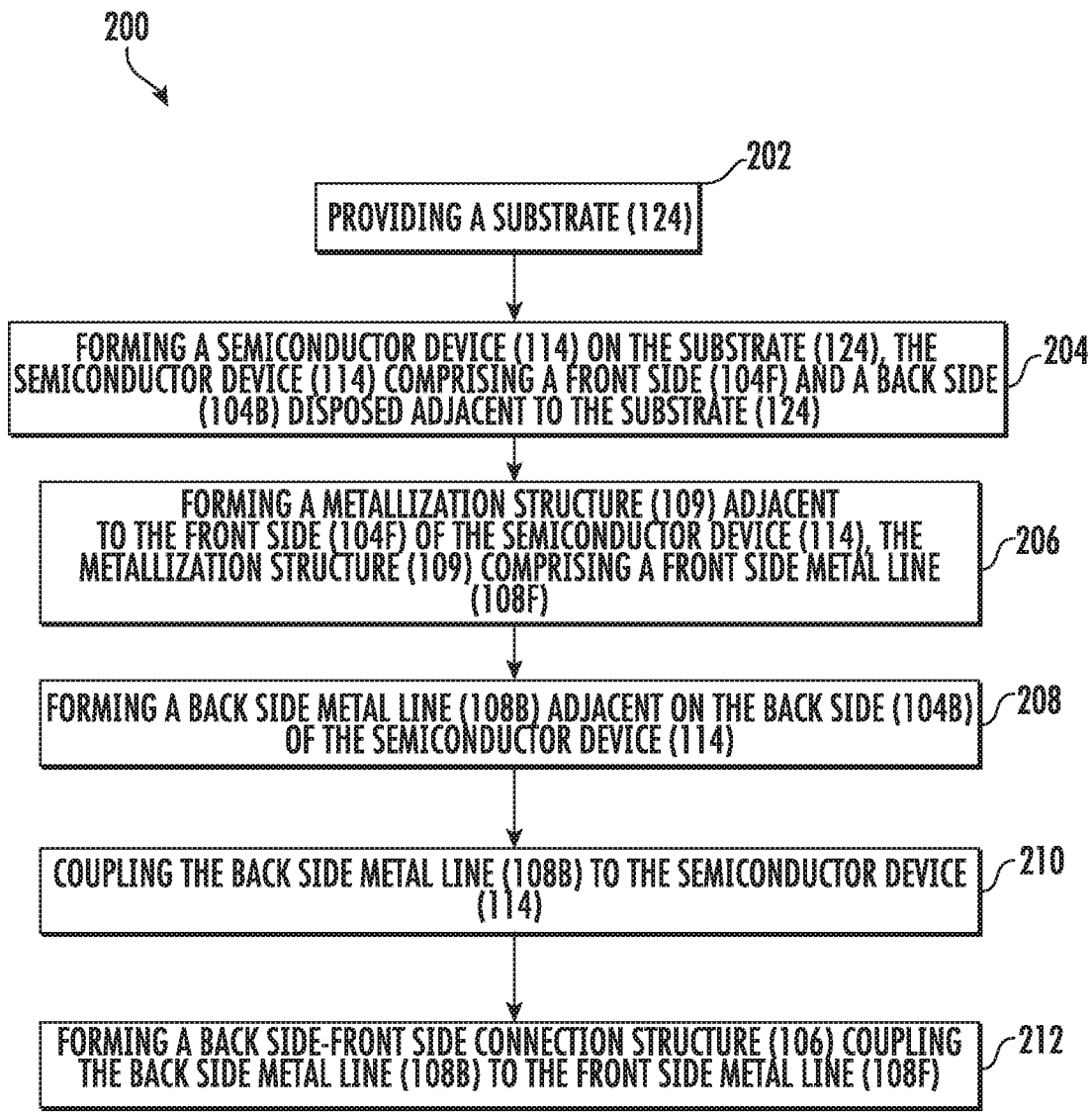
FIG. 2 is a flowchart illustrating an exemplary process of fabricating a circuit like the circuits in FIGS. 1A-1B.

FIG. 2 is a flowchart illustrating an exemplary process 200 of fabricating the circuit 100 in FIGS. 1A and 1B. The process 200 in FIG. 2 will be discussed in reference to the circuit 100 in FIGS. 1A and 1B. In this regard, a first step of the process 200 can be to provide a substrate 124 to serve as a base layer or material for forming semiconductor devices 114 and other structures of the semiconductor die 120 (block 202 in FIG. 2). For example, the substrate 124 may be a semiconductor material such as silicon, aluminum oxide, or gallium arsenide, as examples. A next step in the process 200 can be to form semiconductor device 114 on the substrate 124 (block 204 in FIG. 2). For example, the PFET 116P and NFET 116N in the CMOS circuit 112 in FIGS. 1A and 1B described above are examples of semiconductor devices 114 that can be formed with the substrate 124. The semiconductor device 114 comprises a front side 104F and a back side 104B disposed adjacent to the substrate 124. A next step in the process 200 can be to form the metallization structure 109 adjacent to the front side 104F of the semiconductor device 114 (block 206 in FIG. 2). The metallization structure 109 is an interconnect structure that comprises one or more metal layers that can each include one or more formed metal lines to provide connections to the semiconductor device 114 and other interconnections extending to external interconnects (e.g., bumps) to a package including the semiconductor layer 148. The metallization structure 109 comprises a front side metal line 108F in a metal layer therein. A next step in the process 200 can be to form a back side metal line 108B adjacent on the back side 104B of the semiconductor device 114 (block 208 FIG. 2). A next step in the process 200 can be to couple the back side metal line 108B to the semiconductor device 114 to provide back side routing for the semiconductor device 114 (block 210 in FIG. 2). A next step in the process 200 can be to form a back side-front side connection structure 106 coupling the back side metal line 108B to the front side metal line 108F to couple signals routinely in the back side metal line 108B to the front side metal line 108F (block 212 in FIG. 2).

Figure 3A:
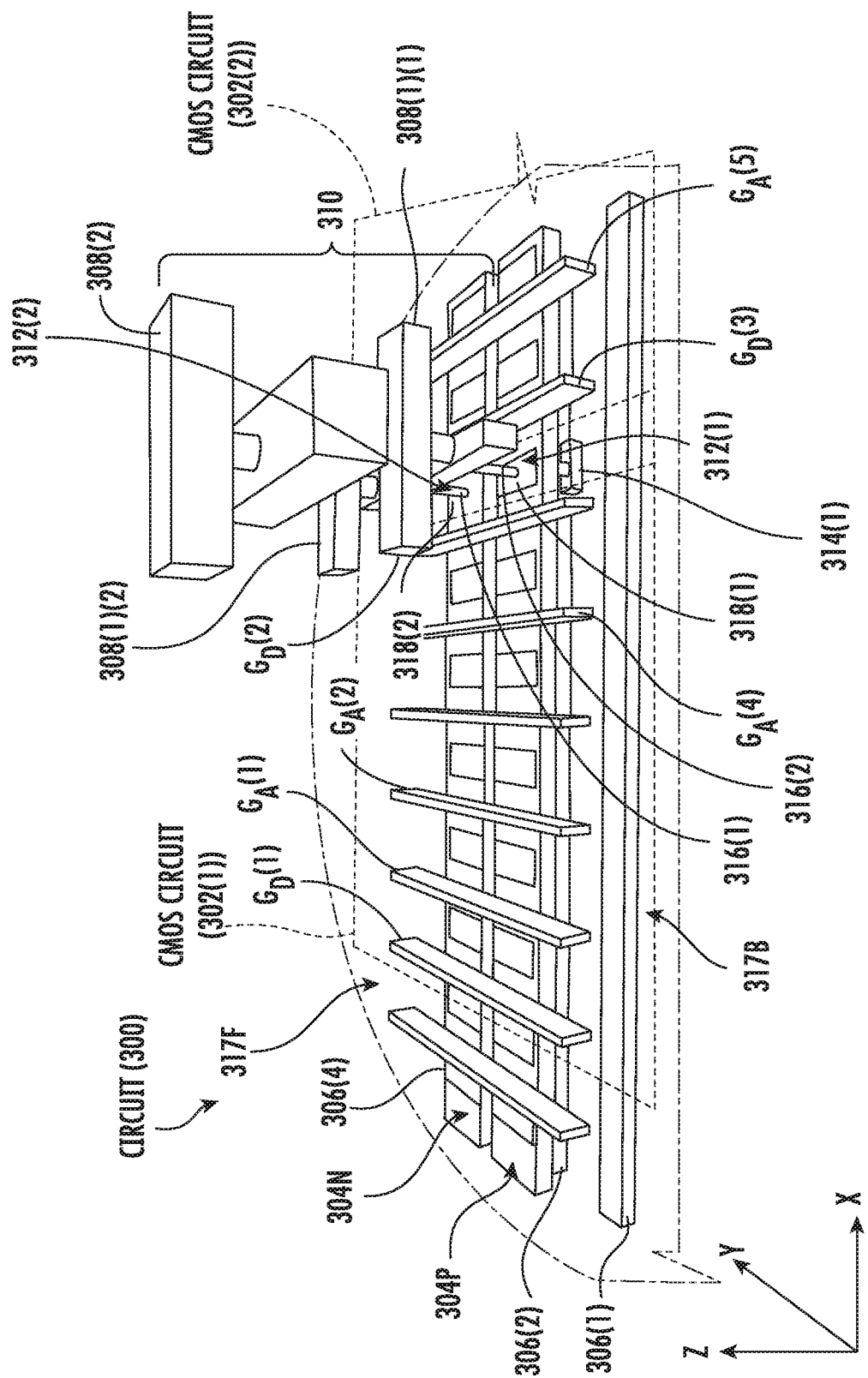
FIG. 3A is a top perspective view of another exemplary circuit in the exemplary form of an exemplary complementary metal-oxide semiconductor (CMOS) circuit that includes front side and back side routing coupled to a FET, and further includes a back side-front side connection structure coupling the front side routing to the back side routing coupled to the FET.
Figures 2, 3B:
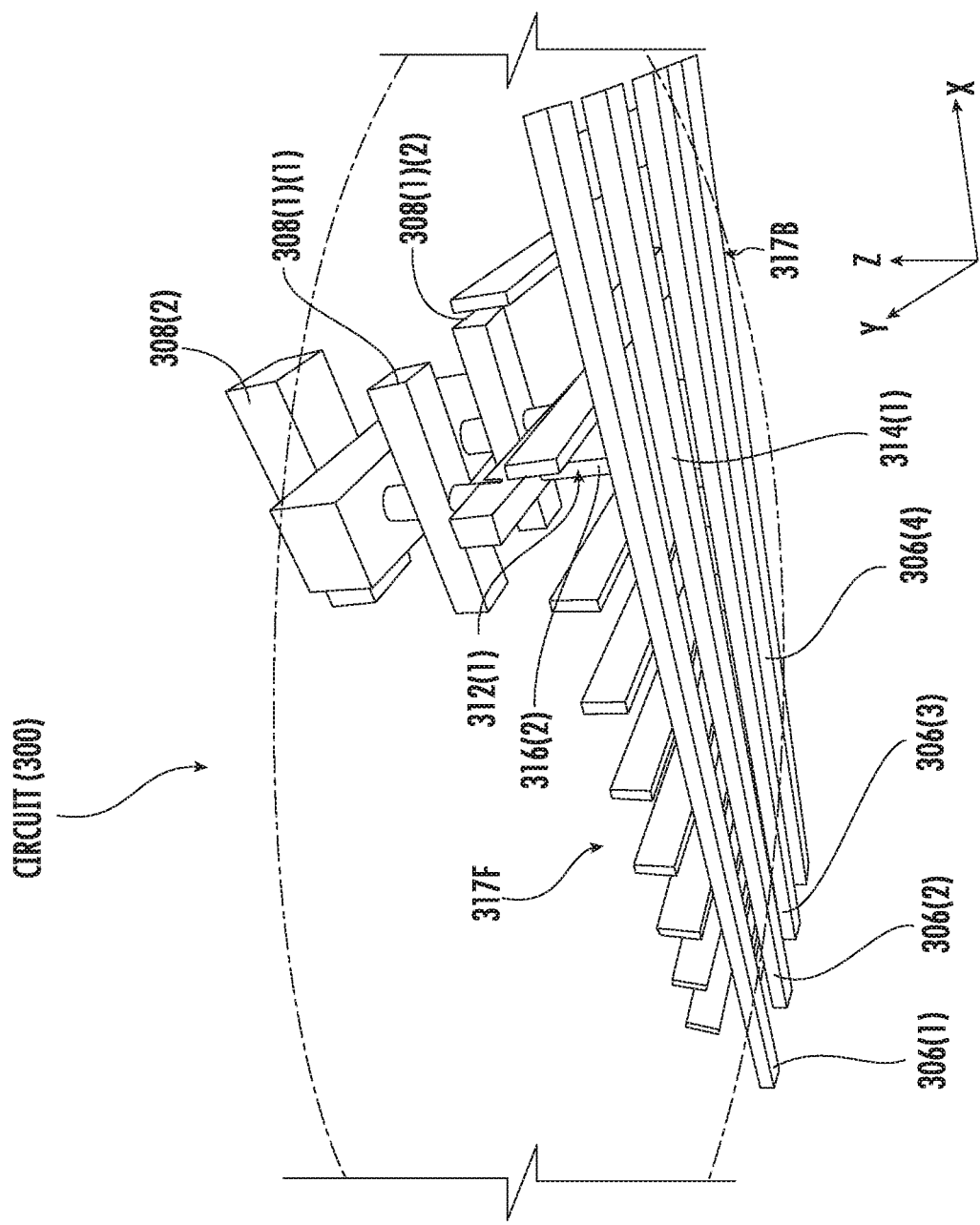
Figure 3C:
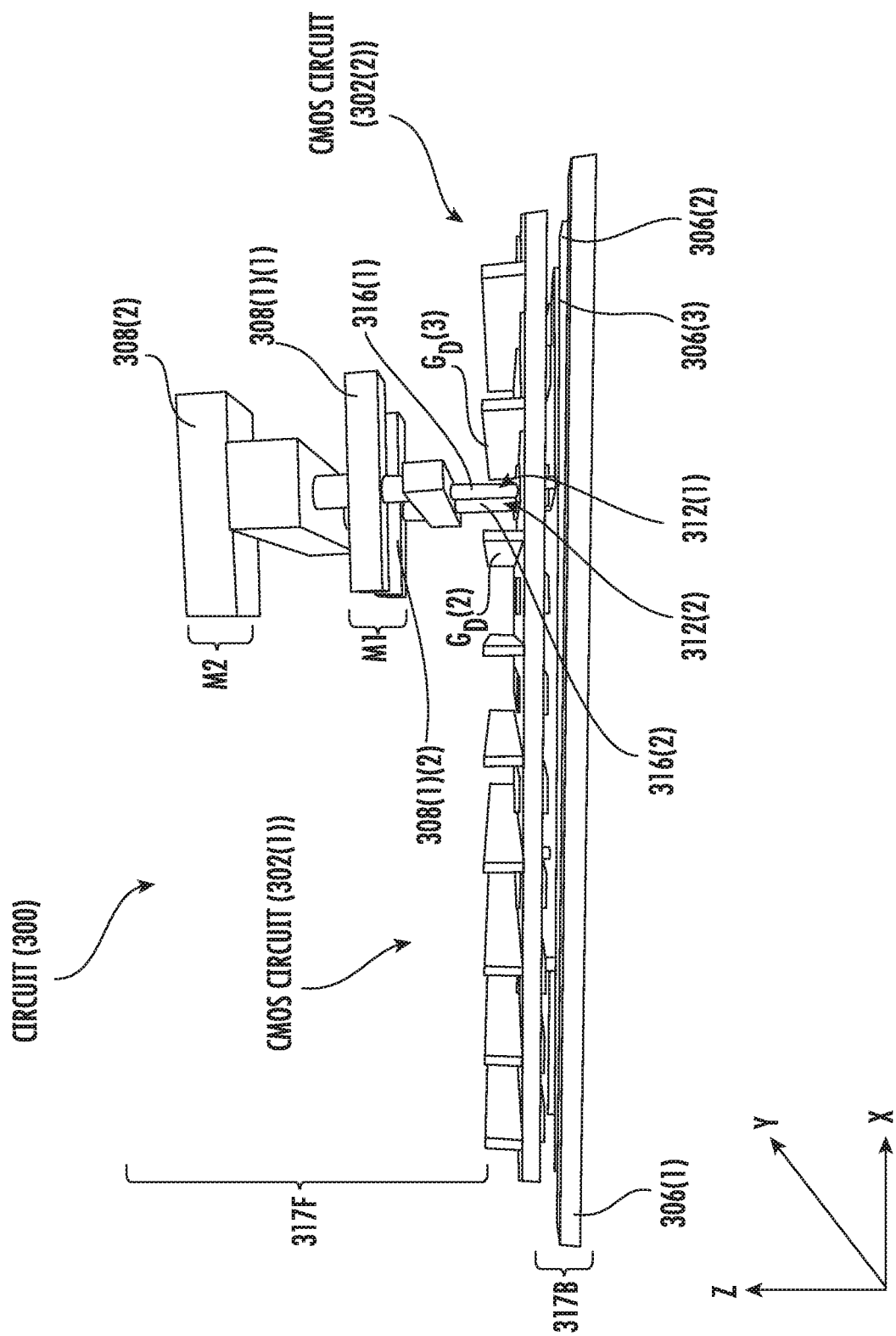
FIG. 3C is a front view of the circuit in FIG. 3A.
Figure 3D:
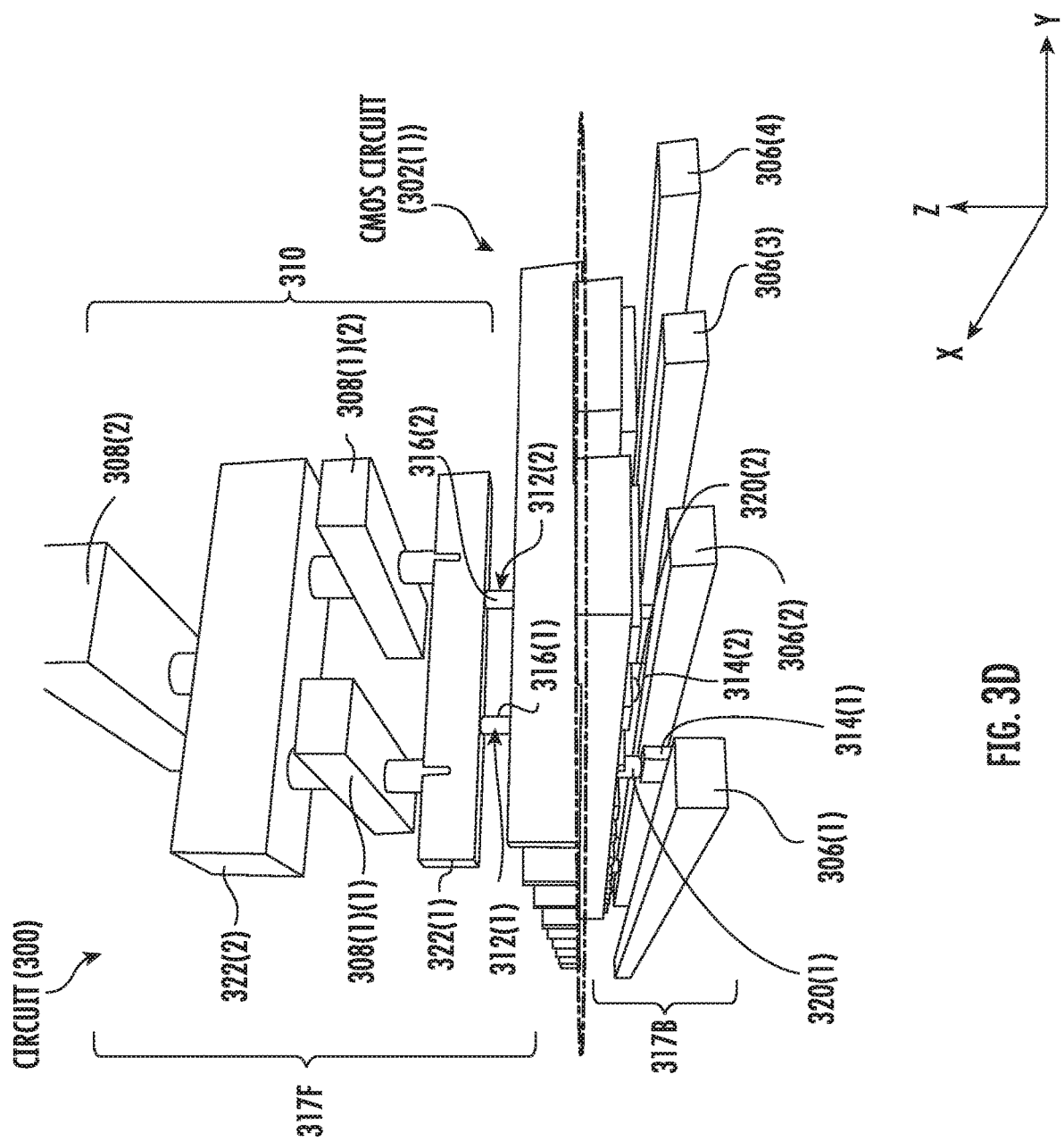
FIGS. 3D and 3E are side perspective and side views, respectively, of the circuit in FIG. 3A.
Figure 3E:
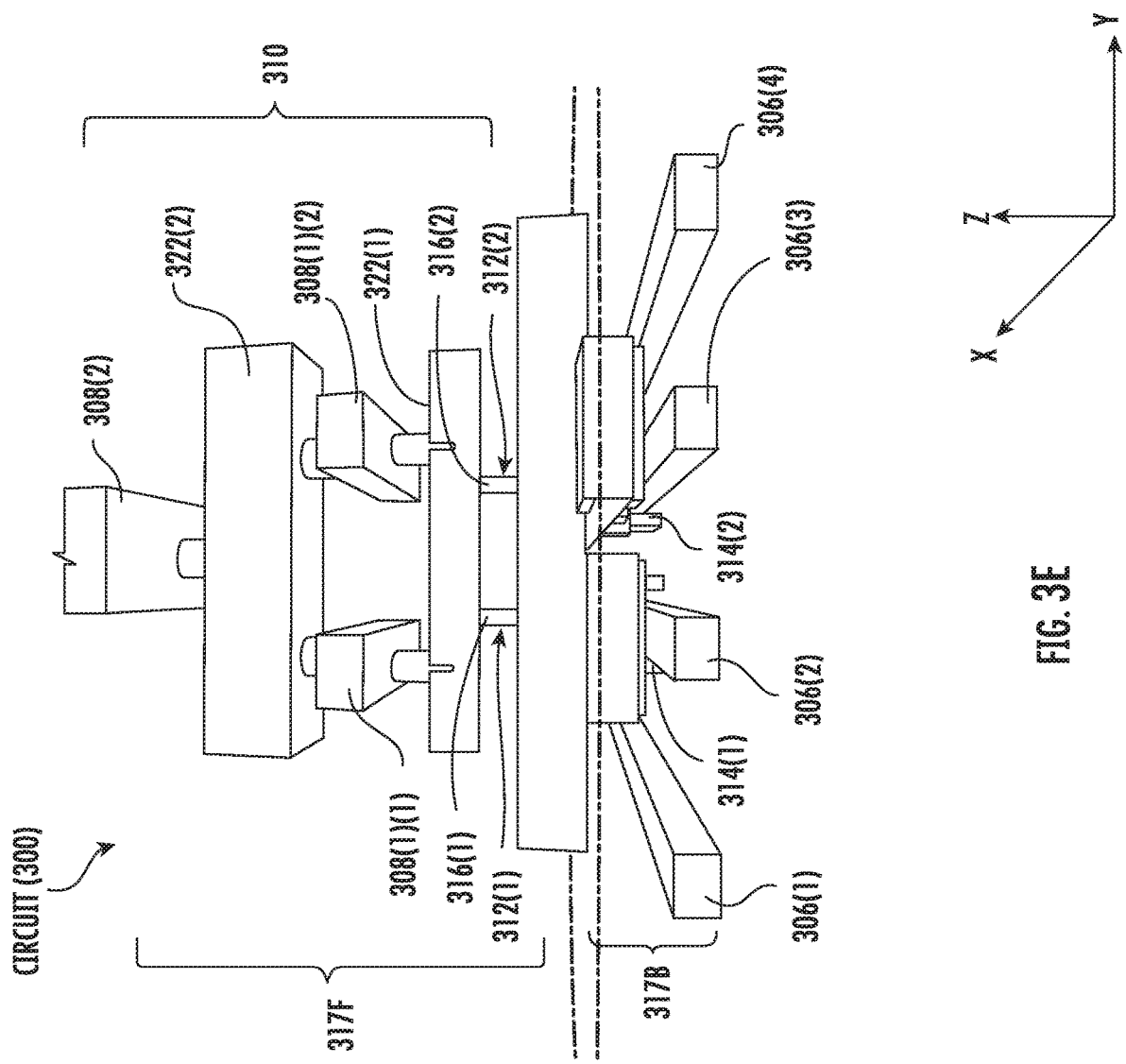

FIG. 3A is a top perspective view of another exemplary circuit 300 that includes front side and back side routing, and further includes a back side-front side connection structure coupling the front side routing to the back side routing. FIGS. 3B-1 and 3B-2 are right and left, front perspective views, respectively, of the circuit 300 in FIG. 3A. FIG. 3C is a front view of the circuit 300 in FIG. 3A. FIGS. 3D and 3E are side perspective and side views, respectively, of the circuit 300 in FIG. 3A.

As shown in FIGS. 3A-3E, the circuit 300 includes two CMOS circuits 302(1), 302(2) that are fabricated according to a circuit cell layout. The CMOS circuit 302(1) includes active gates $G_A(1)$-$G_A(4)$ disposed between two dummy gates $G_D(1)$ and $G_D(2)$. The adjacent CMOS circuit 302(2) to CMOS circuit 302(1) is shown as including dummy gate $G_D(3)$ disposed adjacent to dummy gate $G_D(2)$ in CMOS circuit 302(1) and active gate $G_A(5)$. As also shown in FIGS. 3A-3E, the circuit 300 includes an N-type diffusion region 304N and a P-type diffusion region 304P that extends longitudinally in the X-axis direction according both CMOS circuits 302(1), 302(2). As discussed in a similar example of the CMOS circuit 112 in FIGS. 1A and 1B, PFETs and NFETs can be formed in the respective N-type diffusion region 304N and P-type diffusion region 304P, respectively, in the CMOS circuits 302(1), 302(2).

As shown in FIGS. 3A-3E, back side metal lines 306(1)-306(4) are disposed below the N-type diffusion region 304N and the P-type diffusion region 304P to provide back side routing for the CMOS circuits 302(1), 302(2). Front side metal lines 308(1)(1), 308(1)(2), 308(2) are disposed above the N-type diffusion region 304N and P-type diffusion region 304P in a metallization structure 310 to provide for front side routing to the CMOS circuits 302(1), 302(2). In this example, front side metal lines 308(1)(1), 308(1)(2) are disposed in a first metal layer (M1) of the metallization structure 310, and front side metal line 308(2) is disposed in a second metal layer (M2) of the metallization structure 310. As shown in FIGS. 3A-3E, and particularly in FIGS. 3D and 3E, two (2) back side-front side connection structures 312 (1), 312(2) are disposed between the two dummy gates $G_{D(2)}$, $G_{D(3)}$ to couple additional back side metal lines 314(1), 314(2) to the front side metal lines 308(1)(1), 308(1)(2). The back side-front side connection structure 312(1) is used to couple the back side metal line 314(1) to the front side metal line 308(1)(1). The back side-front side connection structure 312(2) is used to couple the back side metal line 314(2) to the front side metal line 308(1)(2). In this example, the back side-front side connection structures 312(1), 312(2) include conductive elements 316(1), 316(2), that can be conductive pillars or vias, including TSVs above the respective N-type diffusion region 304N and P-type diffusion region 304P in a front side 317F of the circuit 300. The back side-front side connection structures 312(1), 312

(2) are configured to lift and couple signals routed in the back side metal lines 314(1), 314(2) to the front side metal lines 308(1)(1), 308(1)(2).

With continuing reference to FIGS. 3A-3B-2, the back side-front side connection structures 312(1), 312(2) and its conductive elements 316(1), 316(2) are disposed in contact with respective front side metal contacts 318(1), 318(2) disposed above the respective N-type diffusion region 304N and P-type diffusion region 304P. As shown in FIG. 3D, the back side-front side connection structures 312(1), 312(2) also include additional conductive elements 320(1), 320(2), which may be conductive pillars or vias for example, below the N-type diffusion region 304N and P-type diffusion region 304P in a back side 317B of the circuit 300. The conductive elements 320(1), 320(2) are coupled to and in contact with the respective back side metal lines 314(1), 314(2) to couple the back side metal lines 314(1), 314(2) to the front side metal lines 308(1)(1), 308(1)(2). In this example, as shown FIG. 3E, intermediate metal lines 322(1), 322(2) are provided in the metallization structure 310 to bridge the coupling of the back side metal lines 314(1), 314(2) to the front side metal lines 308(1)(1), 308(1)(2). For example, power may be routed through the back side metal lines 314(1), 314(2), which is then routed to the front side metal lines 308(1)(1), 308(1)(2) through the back side-front side connection structures 312(1), 312(2). For example, it may be desired to provide the multiple back side-front side connection structures 312(1), 312(2) to provide more material to lower the resistance of the coupling of the back side metal lines 314(1), 314(2) to the front side metal lines 308(1)(1), 308(1)(2). Providing the multiple back side-front side connection structures 312(1), 312(2) in this example may also be employed to take advantage of the space between the two dummy gates $G_{D(2)}$, $G_{D(3)}$.

Figure 4A:
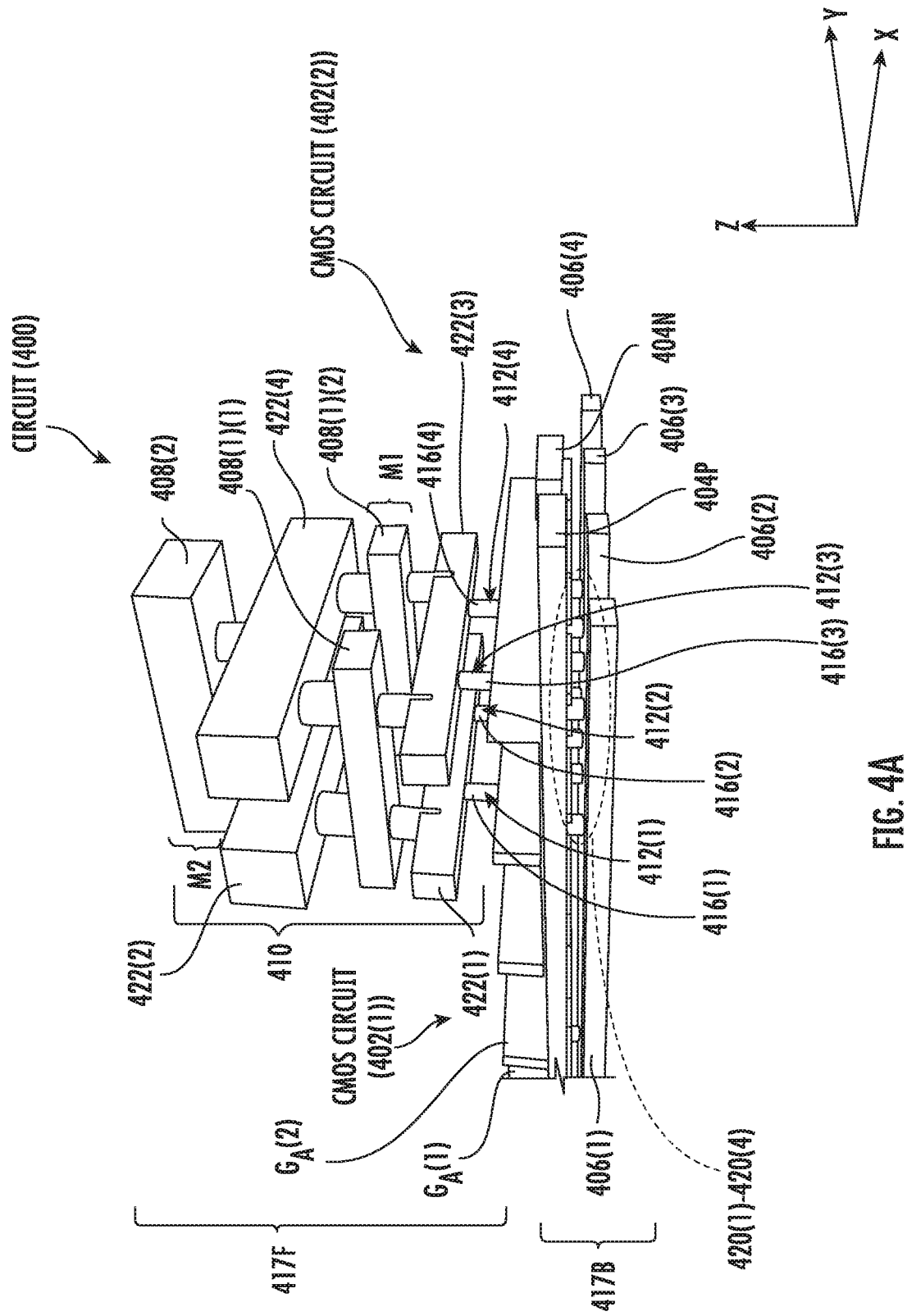
FIG. 4A is a front, side perspective view of another exemplary circuit in the exemplary form of an exemplary CMOS circuit that includes front side and back side routing coupled to a FET, and further includes a back side-front side connection structure coupling the front side routing to the back side routing coupled to the FET.
Figure 4B:
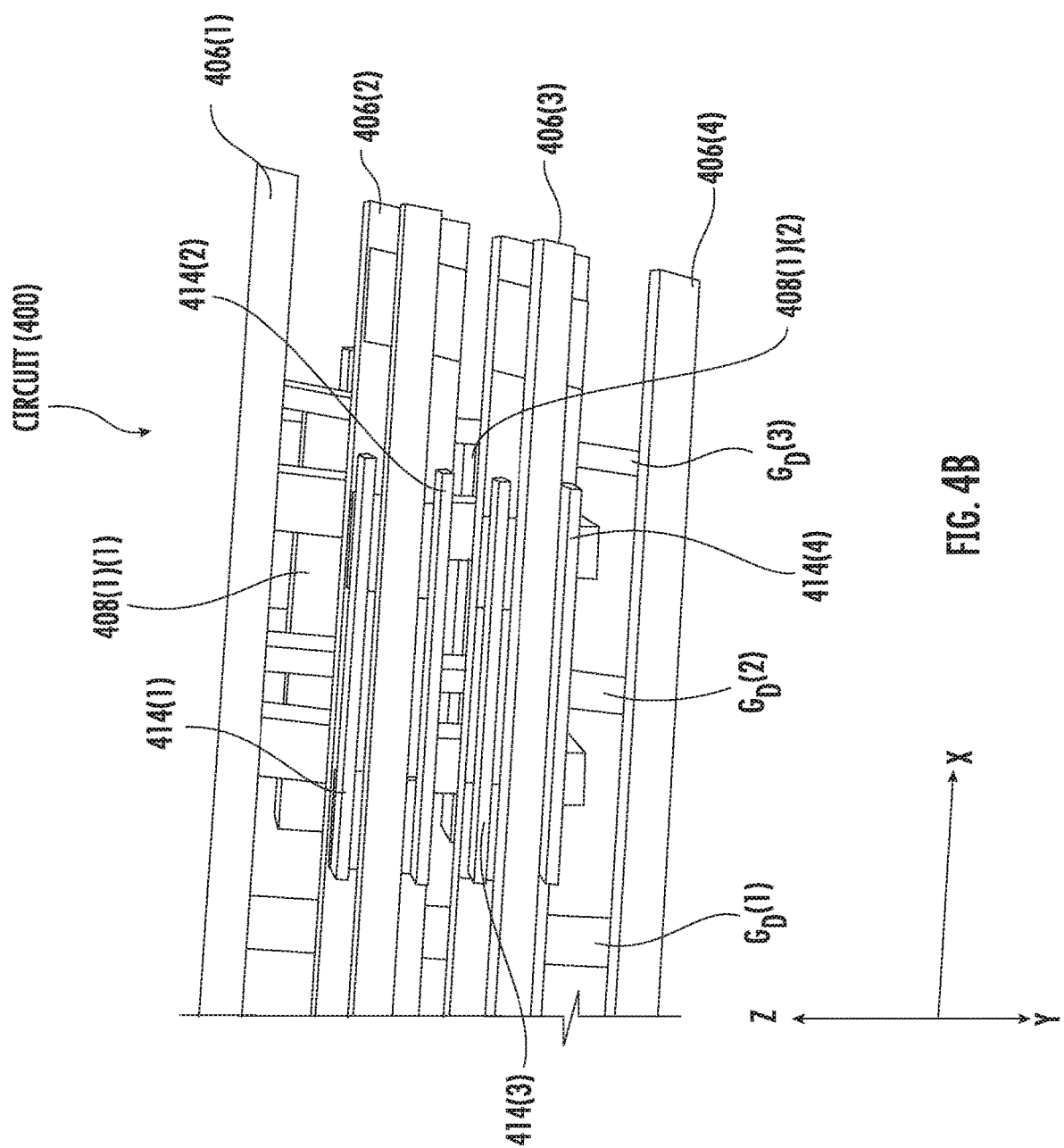
FIG. 4B is a bottom, side perspective view of the circuit in FIG. 4A.

FIG. 4A is a front, side perspective view of another exemplary circuit 400 that includes front side and back side routing, and further includes a back side-front side connection structure coupling the front side routing to the back side routing. FIG. 4B is a bottom, side perspective view of the circuit in FIG. 4A.

As shown in FIGS. 4A and 4B, the circuit 400 includes two CMOS circuits 402(1), 402(2) that are fabricated according to a circuit cell layout. The CMOS circuit 402(1) includes active gates $G_A(1)$, $G_A(2)$ and three (3) dummy gates $G_D(1)$-$G_D(3)$ to provide additional isolation between adjacent CMOS circuits 402(1), 402(2). As also shown in FIG. 4A, the circuit 300 includes an N-type diffusion region 404N and a P-type diffusion region 404P that extends longitudinally in the X-axis direction according to both CMOS circuits 402(1), 402(2). As discussed in a similar example of the CMOS circuit 112 in FIGS. 1A and 1B, PFETs and NFETs can be formed in the respective N-type diffusion region 404N and P-type diffusion region 404P in the CMOS circuits 402(1), 402(2).

As shown in FIGS. 4A and 4B, back side metal lines 406(1)-406(4) are disposed below the N-type diffusion region 404N and P-type diffusion region 404P to provide back side routing for the CMOS circuits 402(1), 402(2). As shown in FIG. 4A, front side metal lines 408(1)(1), 408(1)(2), 408(2) are disposed above the N-type diffusion region 404N and P-type diffusion region 404P in a metallization structure 410 to provide for front side routing to the CMOS circuits 402(1), 402(2). In this example, as shown in FIG. 4A, front side metal lines 408(1)(1), 408(1)(2) are disposed in a first metal layer (M1) of the metallization structure 410, and front side metal line 408(2) is disposed in a second metal layer (M2) of the metallization structure 410. Two (2) back side-front side connection structures 412(1), 412(2) are disposed through the dummy gate $G_{D(2)}$ to couple additional back side metal lines 414(1), 414(2) to the front side metal lines 408(1)(1), 408(1)(2). The back side-front side connection structure 412(1) is used to couple the back side metal line 414(1) to the front side metal line 408(1)(1). The back side-front side connection structure 412(2) is used to couple the back side metal line 414(2) to the front side metal line 408(1)(2). Two (2) back side-front side connection structures 412(3), 412(4) are also disposed through the dummy gate $G_{D(3)}$ to couple additional back side metal lines 414(3), 414(4) to the front side metal lines 408(1)(1), 408(1)(2). This may be to reduce resistance of the back side to front side routing since there is additional area due to the three (3) adjacent dummy gates $G_{D(1)}$-$G_{D(3)}$. The back side-front side connection structure 412(3) is used to couple the back side metal line 414(3) to the front side metal line 408(1)(1). The back side-front side connection structure 412(4) is used to couple the back side metal line 414(4) to the front side metal line 408(1)(2). In this example, the back side-front side connection structures 412(1)-414(4) include respective conductive elements 416(1)-416(4), that can be conductive pillars or vias, including TSVs above the respective N-type diffusion region 404N and P-type diffusion region 404P in a front side 417F of the circuit 400 as shown in FIG. 4A. The back side-front side connection structures 412(1)-412(2) are configured to lift and couple signals routed in the back side metal lines 414(1)-414(2) to the front side metal lines 408(1)(1), 408(1)(2).

With continuing reference to FIGS. 4A and 4B, the back side-front side connection structures 412(1)-412(4) also include additional respective conductive elements 420(1)-420(4), which may be conductive pillars or vias for example, below the N-type diffusion region 404N and P-type diffusion region 404P in a back side 417B of the circuit 400. The conductive elements 420(1)-420(4) are coupled to and are in contact with the respective back side metal lines 414(1), 414(2) to couple the respective back side metal lines 414(1), 414(2) to the front side metal lines 408(1)(1), 408(1)(2). In this example, as shown FIG. 4A, intermediate metal lines 422(1)-422(4) are provided in the metallization structure 410 to bridge the coupling of the back side metal lines 414(1), 414(2) to the front side metal lines 408(1)(1), 408(1)(2). For example, power may be routed through the back side metal lines 414(1), 414(2), which is then routed to the front side metal lines 408(1)(1), 408(1)(2) through the back side-front side connection structures 412(1)-412(4). For example, it may be desired to provide the multiple back side-front side connection structures 412(1)-412(4) to provide more material to lower the resistance of the coupling of the back side metal lines 414(1)-414(4) to the front side metal lines 408(1)(1), 408(1)(2).

It is noted that the terms "front," "front side," "bottom," and "bottom side" where used herein are relative terms. These terms are not meant to limit or imply a strict orientation that "front" or "front side" is above "bottom" or "bottoms side" relative to ground, but only a relative orientation to another stated orientation. For example, a "front side" of an element is a side that is on an opposite side of the element as the "bottom side."

Circuits that include front side and back side routing, and further include a back side-front side connection structure coupling the front side routing to the back side routing, including but not limited to the circuits in FIGS. 1A-1B, 3A-3E, and 4A-4B, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 5:
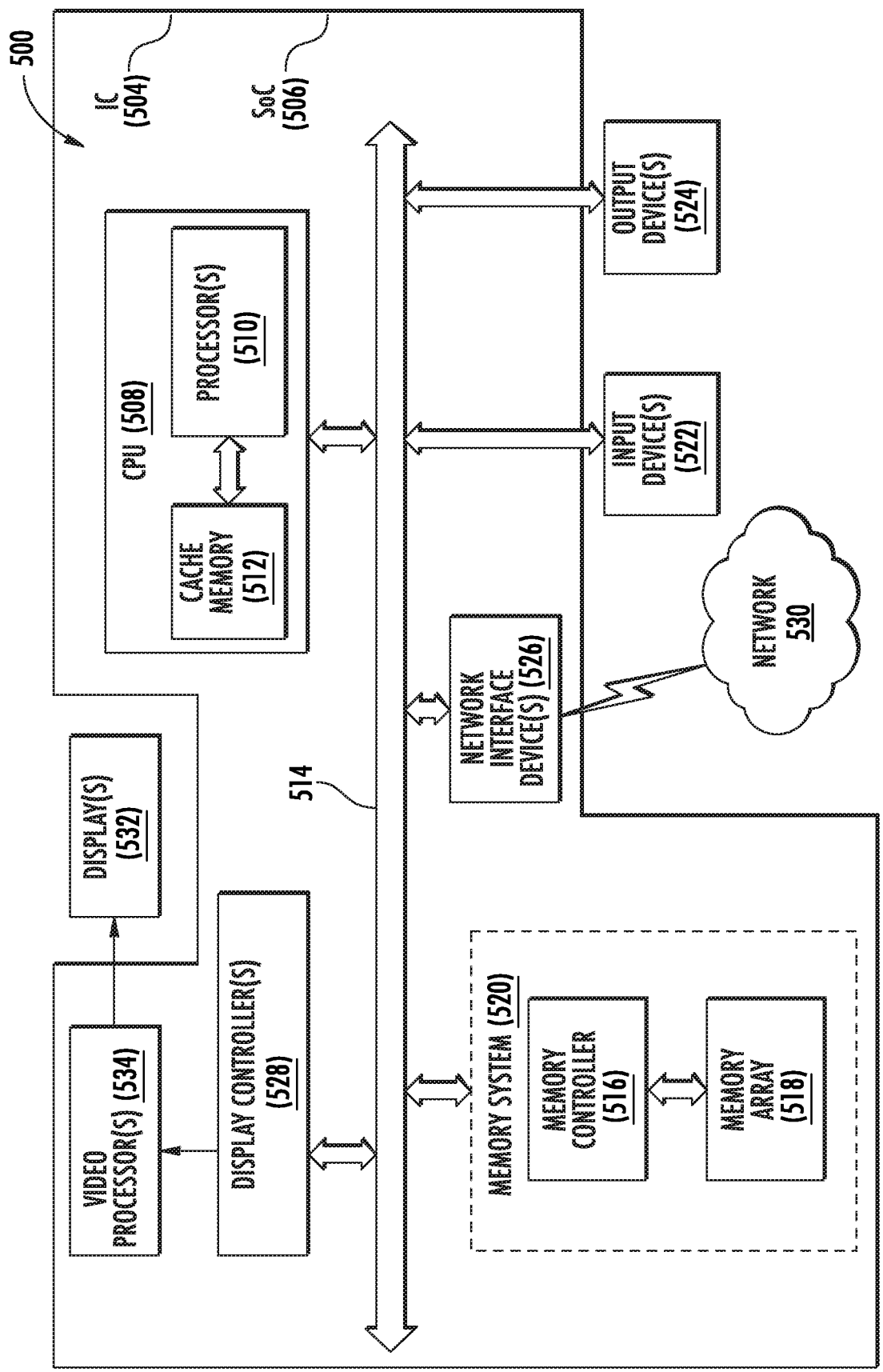
FIG. 5 is a block diagram of an exemplary processor-based system that can include circuits that include front side and back side routing, and further include a back side-front side connection structure coupling the front side routing to the back side routing, including but not limited to the circuits in FIGS. 1A-1B, 3A-3E, and 4A-4B.

In this regard, FIG. 5 illustrates an example of a processor-based system 500 that includes circuits that include front side and back side routing, and further include a back side-front side connection structure coupling the front side routing to the back side routing, including but not limited to the circuits in FIGS. 1A-1B, 3A-3E, and 4A-4B, and according to any aspects disclosed herein in various components of the system. For example, the circuits may be FETs that are employed in CMOS circuits. In this example, the processor-based system 500 may be formed as an IC 504 as a system-on-a-chip (SoC) 506. The processor-based system 500 includes a CPU 508 that includes one or more processors 510, which may also be referred to as CPU cores or processor cores. The CPU 508 may have a cache memory 512 coupled to the CPU 508 for rapid access to temporarily stored data. The CPU 508 is coupled to a system bus 514 and can intercouple master and slave devices included in the processor-based system 500. As is well known, the CPU 508 communicates with these other devices by exchanging address, control, and data information over the system bus 514. For example, the CPU 508 can communicate bus transaction requests to a memory controller 516 as an example of a slave device. Although not illustrated in FIG. 5, multiple system buses 514 could be provided, wherein each system bus 514 constitutes a different fabric.

Other master and slave devices can be connected to the system bus 514. As illustrated in FIG. 5, these devices can include a memory system 520 that includes the memory controller 516 and a memory array(s) 518, one or more input devices 522, one or more output devices 524, one or more network interface devices 526, and one or more display controllers 528, as examples. Each of the memory system 520, the one or more input devices 522, the one or more output devices 524, the one or more network interface devices 526, and the one or more display controllers 528 can include the circuits. The input device(s) 522 can include any type of input device, including but not limited to input keys, switches, voice processors, etc. The output device(s) 524 can include any type of output device, including, but not limited to, audio, video, other visual indicators, etc. The network interface device(s) 526 can be any device configured to allow exchange of data to and from a network 530. The network 530 can be any type of network, including but not limited to a wired or wireless network, a private or public network, a local area network (LAN), a wireless local area network (WLAN), a wide area network (WAN), a BLUETOOTH™ network, and the Internet. The network interface device(s) 526 can be configured to support any type of communications protocol desired.

The CPU 508 may also be configured to access the display controller(s) 528 over the system bus 514 to control information sent to one or more displays 532. The display controller(s) 528 sends information to the display(s) 532 to be displayed via one or more video processors 534, which process the information to be displayed into a format suitable for the display(s) 532. The display(s) 532 can include any type of display, including, but not limited to, a cathode ray tube (CRT), a liquid crystal display (LCD), a plasma display, a light emitting diode (LED) display, etc.

Figure 6:
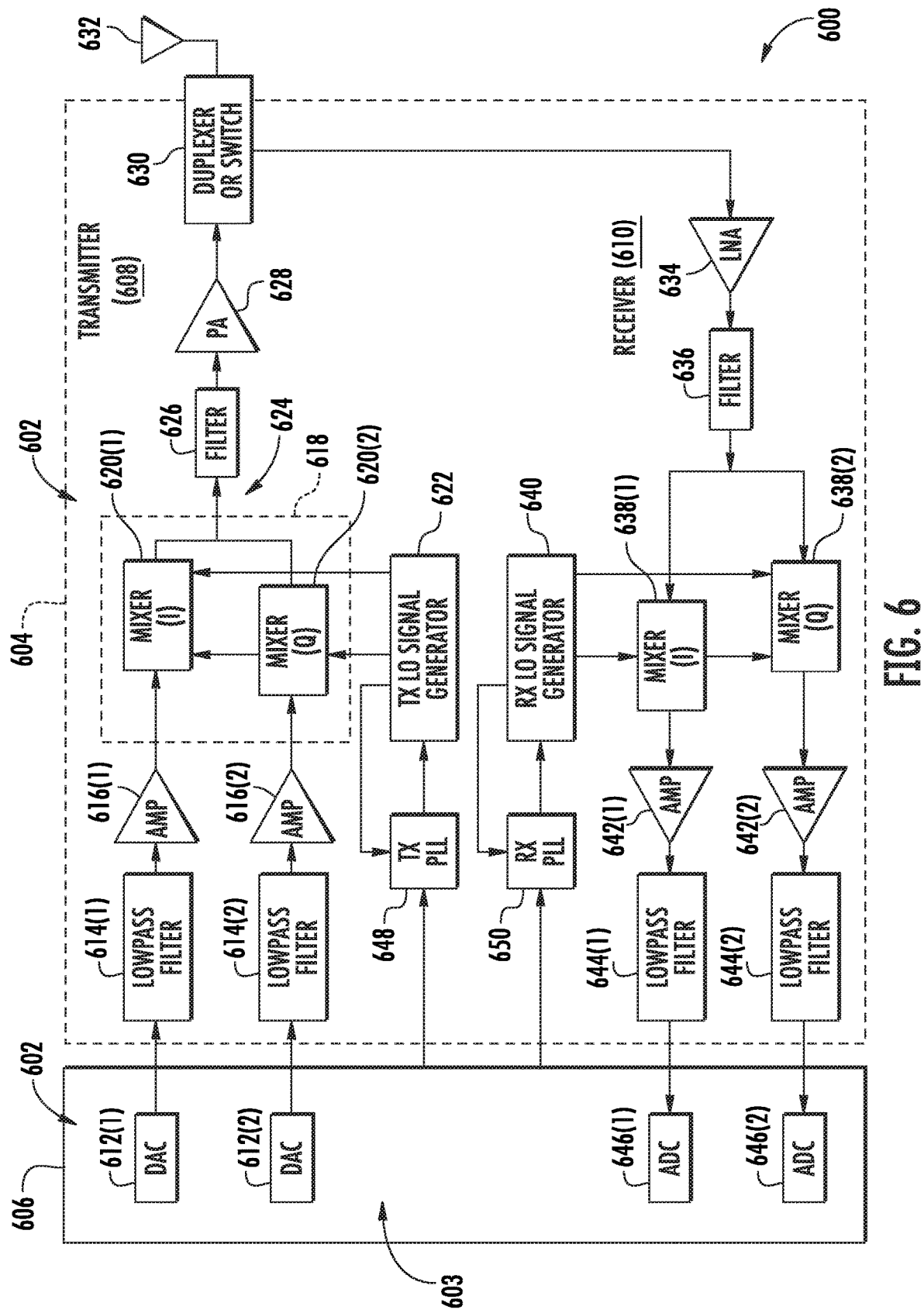
FIG. 6 is a block diagram of an exemplary wireless communications device that includes radio frequency (RF) components formed from circuits that include front side and back side routing, and further includes a back side-front side connection structure coupling the front side routing to the back side routing, including but not limited to the circuits in FIGS. 1A-1B, 3A-3E, and 4A-4B.

FIG. 6 illustrates an exemplary wireless communications device 600 that includes radio frequency (RF) components formed from one or more ICs 602, wherein any of the ICs 602 can include circuits that include front side and back side routing, and further include a back side-front side connection structure coupling the front side routing to the back side routing, including but not limited to the circuits in FIGS. 1A-1B, 3A-3E, and 4A-4B, and according to any aspects disclosed herein. For example, the circuits may be FETs that are employed in CMOS circuits, and according to any aspects disclosed herein.

The wireless communications device 600 may include or be provided in any of the above referenced devices, as examples. As shown in FIG. 6, the wireless communications device 600 includes a transceiver 604 and a data processor 606. The data processor 606 may include a memory to store data and program codes. The transceiver 604 includes a transmitter 608 and a receiver 610 that support bi-directional communications. In general, the wireless communications device 600 may include any number of transmitters 608 and/or receivers 610 for any number of communication systems and frequency bands. All or a portion of the transceiver 604 may be implemented on one or more analog ICs, RF ICs (RFICs), mixed-signal ICs, etc.

The transmitter 608 or the receiver 610 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 600 in FIG. 6, the transmitter 608 and the receiver 610 are implemented with the direct-conversion architecture.

In the transmit path, the data processor 606 processes data to be transmitted and provides I and Q analog output signals to the transmitter 608. In the exemplary wireless communications device 600, the data processor 606 includes digital-to-analog converters (DACs) 612(1), 612(2) for converting digital signals generated by the data processor 606 into I and Q analog output signals, e.g., I and Q output currents, for further processing.

Within the transmitter 608, lowpass filters 614(1), 614(2) filter the I and Q analog output signals, respectively, to remove undesired signals caused by the prior digital-to-analog conversion. Amplifiers (AMP) 616(1), 616(2) amplify the signals from the lowpass filters 614(1), 614(2), respectively, and provide I and Q baseband signals. An upconverter 618 upconverts the I and Q baseband signals with I and Q transmit (TX) local oscillator (LO) signals from a TX LO signal generator 622 through mixers 620(1), 620(2) to provide an upconverted signal 624. A filter 626 filters the upconverted signal 624 to remove undesired signals caused by the frequency upconversion as well as noise in a receive frequency band. A power amplifier (PA) 628 amplifies the upconverted signal 624 from the filter 626 to obtain the desired output power level and provides a transmit RF signal. The transmit RF signal is routed through a duplexer or switch 630 and transmitted via an antenna 632.

In the receive path, the antenna 632 receives signals transmitted by base stations and provides a received RF signal, which is routed through the duplexer or switch 630 and provided to a low noise amplifier (LNA) 634. The duplexer or switch 630 is designed to operate with a specific receive (RX)-to-TX duplexer frequency separation, such that RX signals are isolated from TX signals. The received RF signal is amplified by the LNA 634 and filtered by a filter 636 to obtain a desired RF input signal. Downconversion mixers 638(1), 638(2) mix the output of the filter 636 with I and Q RX LO signals (i.e., LO_I and LO_Q) from an RX LO signal generator 640 to generate I and Q baseband signals. The I and Q baseband signals are amplified by amplifiers (AMP) 642(1), 642(2) and further filtered by lowpass filters 644(1), 644(2) to obtain I and Q analog input signals, which are provided to the data processor 606. In this example, the data processor 606 includes ADCs 646(1), 646(2) for converting the analog input signals into digital signals to be further processed by the data processor 606.

In the wireless communications device 600 of FIG. 6, the TX LO signal generator 622 generates the I and Q TX LO signals used for frequency upconversion, while the RX LO signal generator 640 generates the I and Q RX LO signals used for frequency downconversion. Each LO signal is a periodic signal with a particular fundamental frequency. A TX phase-locked loop (PLL) circuit 648 receives timing information from the data processor 606 and generates a control signal used to adjust the frequency and/or phase of the TX LO signals from the TX LO signal generator 622. Similarly, an RX PLL circuit 650 receives timing information from the data processor 606 and generates a control signal used to adjust the frequency and/or phase of the RX LO signals from the RX LO signal generator 640.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. A circuit, comprising:
 a semiconductor device comprising a front side and a back side;
 a metallization structure disposed adjacent to the front side of the semiconductor device, the metallization structure comprising a front side metal line;
 a back side metal line disposed adjacent to the back side of the semiconductor device, the back side metal line coupled to the semiconductor device;
 a back side-front side connection structure extending in a first direction to couple the back side metal line to the front side metal line; and
 a dummy gate, wherein:
   the back side-front side connection structure is disposed adjacent to the dummy gate in a second direction orthogonal to the first direction; and the back side-front side connection structure is separated from the dummy gate in the second direction.

2. The circuit of claim 1, further comprising:
a second dummy gate disposed adjacent to the dummy gate in the second direction, wherein:
the back side-front side connection structure is further disposed between the dummy gate and the second dummy gate.

3. The circuit of claim 1, wherein the back side-front side connection structure comprises a conductive vertical interconnect access (via).

4. The circuit of claim 1, wherein the back side-front side connection structure comprises a through-silicon via (TSV) disposed through at least a portion of the semiconductor device.

5. The circuit of claim 1, wherein the front side metal line is coupled to the semiconductor device.

6. The circuit of claim 1, further comprising a back side metal contact coupled to the semiconductor device and the back side metal line.

7. The circuit of claim 1, wherein the back side-front side connection structure comprises:
a front side via coupled to the front side metal line; and
a back side via coupled to the back side metal line.

8. The circuit of claim 1, wherein:
the semiconductor device comprises a semiconductor layer comprising a front side and a back side;
the front side of the semiconductor layer disposed adjacent to the metallization structure; and
the back side of the semiconductor layer disposed adjacent to a substrate; and
the back side-front side connection structure comprises:
a via extending through the semiconductor layer from the front side of the semiconductor layer to the back side of the semiconductor layer and coupled to the front side metal line and the back side metal line.

9. The circuit of claim 1, further comprising a field-effect transistor (FET) circuit, comprising:
a FET, comprising:
a conduction channel disposed above a substrate;
a source disposed in a first end portion of the conduction channel;
a drain disposed in a second end portion of the conduction channel opposite the first end portion; and
a gate disposed above at least a portion of the conduction channel and between the first end portion and the second end portion of the conduction channel; and
the back side metal line in contact with one of the source, the drain, and the gate of the FET.

10. The circuit of claim 9, further comprising a back side metal contact coupled with one of a back surface of the source, a back surface of the drain, and a back surface of the gate;
the back side metal contact coupled to the back side metal line.

11. The circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

12. The circuit of claim 1 integrated into a semiconductor die.

13. A method of fabricating a circuit, comprising:
providing a substrate;
forming a semiconductor device on the substrate, the semiconductor device comprising a front side and a back side disposed adjacent to the substrate;
forming a metallization structure adjacent to the front side of the semiconductor device, the metallization structure comprising a front side metal line;
forming a back side metal line adjacent to the back side of the semiconductor device;
coupling the back side metal line to the semiconductor device;
forming a back side-front side connection structure extending in a first direction to couple the back side metal line to the front side metal line; and
forming a dummy gate, wherein:
the back side-front side connection structure is disposed adjacent to the dummy gate in a second direction orthogonal to the first direction; and
the back side-front side connection structure is separated from the dummy gate in the second direction.

14. The method of claim 13, further comprising:
forming a second dummy gate disposed adjacent to the dummy gate in the second direction, wherein forming the back side-front side connection structure further comprises disposing the back side-front side connection structure between the dummy gate and the second dummy gate.

15. The method of 13, wherein:
forming the semiconductor device on the substrate comprises forming a field-effect transistor (FET) circuit, comprising:
forming a conduction channel disposed above the substrate;
forming a source disposed in a first end portion of the conduction channel;
forming a drain disposed in a second end portion of the conduction channel opposite the first end portion; and
forming a gate disposed above at least a portion of the conduction channel and between the first end portion and the second end portion of the conduction channel; and
the back side metal line is in contact with one of the source, the drain, and the gate of the FET circuit.

16. A complementary metal-oxide semiconductor (CMOS) circuit, comprising:
a positive (P)-type (P-type) field-effect transistor (FET) (PFET);
a negative (N)-type (N-type) FET (NFET);
a metallization structure disposed adjacent to a front side of at least one of the PFET and the NFET, the metallization structure comprising a front side metal line;
a back side metal line disposed adjacent to a back side of at least one of the NFET and the PFET, the back side metal line coupled to at least one of the NFET and the PFET;
a back side-front side connection structure extending in a first direction to couple the back side metal line to the front side metal line; and
a dummy gate, wherein:

the back side-front side connection structure is disposed adjacent to the dummy gate in a second direction orthogonal to the first direction; and the back side-front side connection structure is separated from the dummy gate in the second direction.

17. The CMOS circuit of claim 16, further comprising:

a second dummy gate disposed adjacent to the dummy gate in the second direction, wherein:

the back side-front side connection structure is further disposed between the dummy gate and the second dummy gate.

* * * * *